United States Patent [19]

Nguyen

[11] Patent Number: 5,204,557
[45] Date of Patent: Apr. 20, 1993

[54] DIGITAL SIGNAL LEVEL TRANSLATOR

[75] Inventor: Thai M. Nguyen, Santa Clara, Calif.

[73] Assignee: National Semiconductor Corporation, Santa Clara, Calif.

[21] Appl. No.: 776,838

[22] Filed: Oct. 15, 1991

[51] Int. Cl.$^5$ .................................................. H03K 19/094
[52] U.S. Cl. ..................................... 307/475; 307/443; 307/451; 307/497
[58] Field of Search ............... 307/443, 451, 475, 494, 307/496–497, 500–501

[56] References Cited

U.S. PATENT DOCUMENTS

| | | | |
|---|---|---|---|
| 4,039,862 | 8/1977 | Dingwall et al. | 307/247 R |
| 4,395,645 | 7/1980 | Bernyeszi | 307/450 |
| 4,532,436 | 7/1985 | Bismarck | 307/279 |
| 4,695,744 | 9/1987 | Giordano | 307/279 |
| 4,703,199 | 10/1987 | Ely | 307/264 |
| 4,797,579 | 1/1989 | Lewis | 307/443 |
| 4,841,175 | 6/1989 | De Man et al. | 307/451 X |
| 4,855,624 | 8/1989 | Kertis et al. | 307/475 |
| 4,920,284 | 4/1990 | Denda | 307/475 |
| 4,952,825 | 8/1990 | Yoshida | 307/475 |
| 4,978,870 | 12/1990 | Chen et al. | 307/475 |
| 4,980,583 | 12/1990 | Dietz | 307/475 |
| 4,992,676 | 2/1991 | Gerosa et al. | 307/443 |
| 5,034,629 | 7/1991 | Kinugasa et al. | 307/448 |
| 5,045,721 | 9/1991 | Yan | 307/475 X |
| 5,079,439 | 1/1992 | Wanless | 307/246 |
| 5,097,153 | 3/1992 | Mahler et al. | 307/475 |
| 5,128,560 | 7/1992 | Chern et al. | 307/443 X |
| 5,144,162 | 9/1992 | Tran | 307/443 |

Primary Examiner—David Hudspeth
Attorney, Agent, or Firm—Limbach & Limbach

[57] ABSTRACT

A low static power, digital signal level translator for translating an unbalanced digital signal to a balanced digital signal with a greater dynamic signal range includes two complementary MOSFET latches and a complementary MOSFET output buffer amplifier. The two latches each receive an unbalanced digital input signal (e.g. with TTL voltage levels) and translate it to a second unbalanced digital signal and an asymmetrically balanced digital signal. The symmetrically biased, output buffer amplifier receives these signals and produces therefrom a symmetrically balanced digital output signal with a greater dynamic signal range (e.g. with ±10 volt levels). Various embodiments include two gate-driven complementary MOSFET latches, two source-driven complementary MOSFET latches or a combination of gate-driven and source-driven complementary MOSFET latches, each of which includes a pair of cross-coupled complementary MOSFET totem-pole amplifiers, for providing the second unbalanced digital signal and the asymmetrically balanced digital signal. Each embodiment further includes a complementary MOSFET totem-pole output buffer amplifier as the symmetrically biased, output buffer amplifier for providing the symmetrically balanced digital output signal.

14 Claims, 8 Drawing Sheets

DIGITAL SIGNAL LEVEL TRANSLATOR

BACKGROUND OF THE INVENTION

1. Field of the Invention

The present invention relates to digital signal level translators, and in particular, to digital signal level translators for converting unbalanced digital signals to balanced digital signals with virtually no static power consumption.

2. Description of the Related Art

Digital signal level translators have become increasingly important in digital signal systems as the types and operating conditions of the various digital logic families have increased (e.g. TTL, ECL, CMOS, BIMOS). Their importance has become even greater as more and more systems are designed to more readily interface with one another in a manner which is transparent to the user.

One common type of digital signal level translator is designed for translating transistor-transistor logic ("TTL") signals to balanced digital signals, such as those used in complementary metal oxide semiconductor field effect transistor ("MOSFET") logic circuits. Such translators are required to convert the unbalanced TTL signals, bounded by zero and +5 volts dc, to balanced digital signals, typically bounded by equal positive and negative voltages (e.g. ±10 volts dc). Various embodiments of such translators currently exist, but suffer from a number of problems, such as wasteful static power dissipation and poor load-driving capability, or "fan out."

Figure 1:
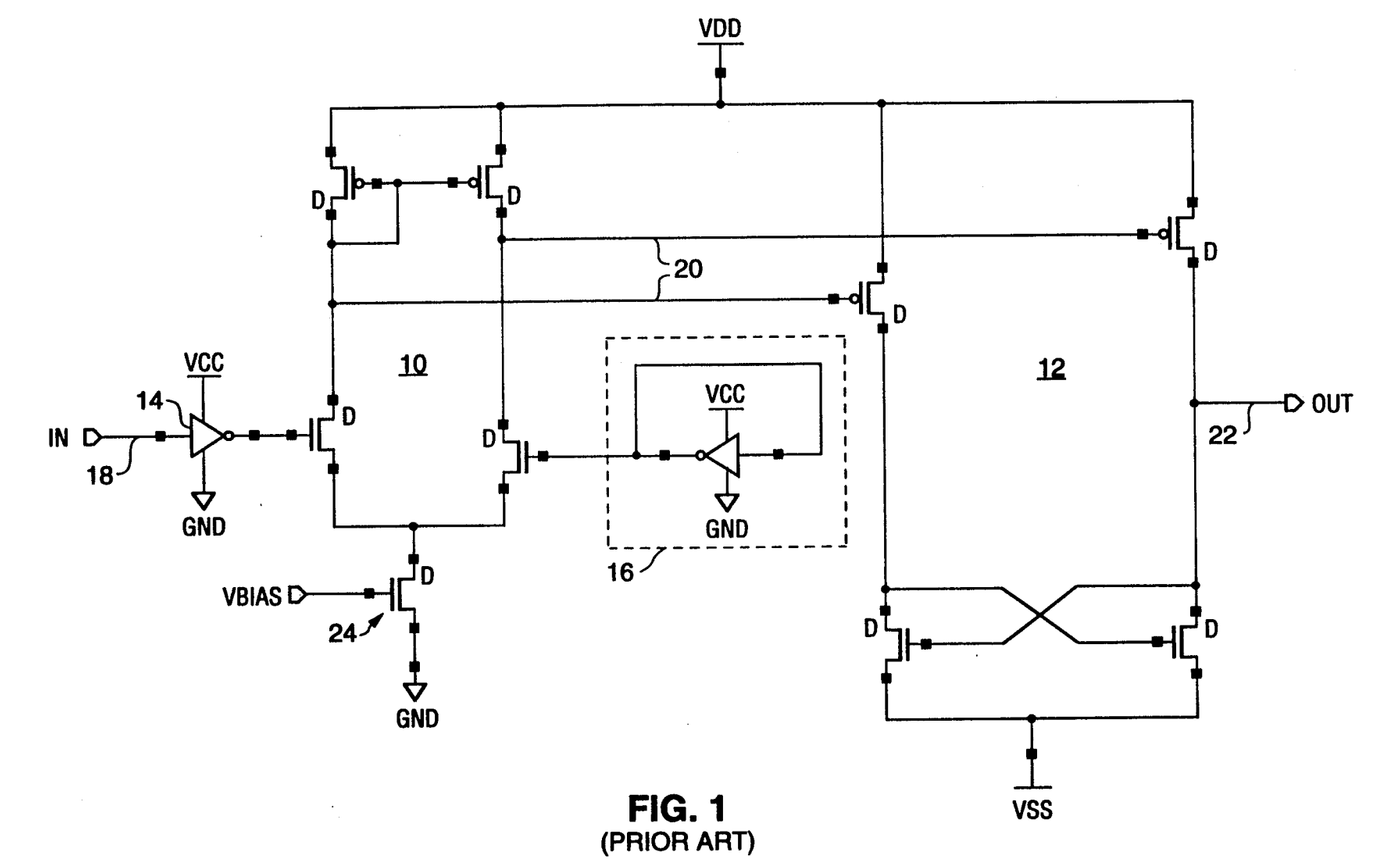
FIG. 1 is schematic diagram of a conventional digital signal level translator.

Referring to FIG. 1, a conventional digital signal level translator consists of a differential amplifier 10, a gate-driven complementary MOSFET latch 12, an inverter 14 and a biasing circuit 16 (discussed further below), connected as shown. The input signal 18, an unbalanced TTL signal bounded by circuit ground and VCC (e.g. +5 volts dc), is initially converted by the differential amplifier 10 to an unbalanced differential signal 20 bounded by circuit ground and VDD (e.g. +10 volts dc). This unbalanced differential signal 20 is then converted by the latch 12 to a balanced output signal 22, bounded by VDD and VSS (e.g. −10 volts dc).

This type of translator suffers from a number of problems. First, the differential amplifier 10, operating as an analog comparator circuit and driven with a current source 24 and biased at a threshold voltage supplied by the biasing circuit 16, is always conductive, i.e. dc biasing current is always flowing through one of its branches. Further, dc biasing current constantly flows through the threshold biasing circuit 16. Thus, static power consumption is relatively high.

Second, the output latch 12, being a cross-coupled circuit, has poor fan out capacity and is relatively slow. The slow switching speed of the latch 12 can be compensated somewhat by increasing the current through the differential amplifier 10 by varying the bias voltage VBIAS on its current source 24. However, this further aggravates the aforementioned problem of high static power consumption.

Figure 2A:
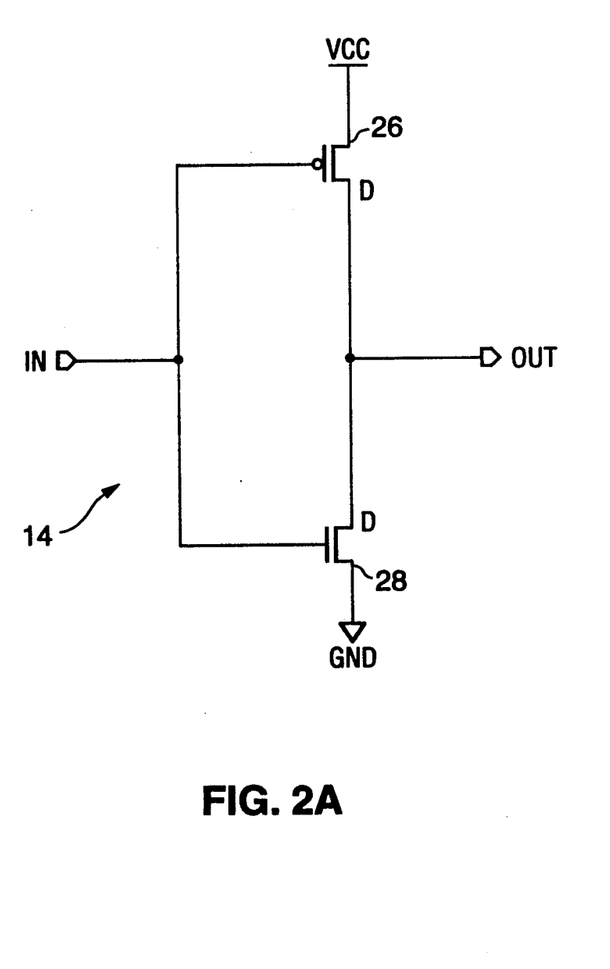
FIGS. 2A-2B are schematic diagrams of a complementary MOSFET inverter configured for use as an inverter and voltage divider biasing circuit, respectively.

Referring to FIG. 2A, the inverter 14 consists of a P-type MOSFET 26 and an N-type MOSFET 28 whose gates are connected together and whose drains are connected together. The source of the P-type MOSFET 26 is connected to VCC and the source of the N-type MOSFET 28 is connected to circuit ground. This type of complementary MOSFET inverter and its operation are well known in the art.

Figure 2B:
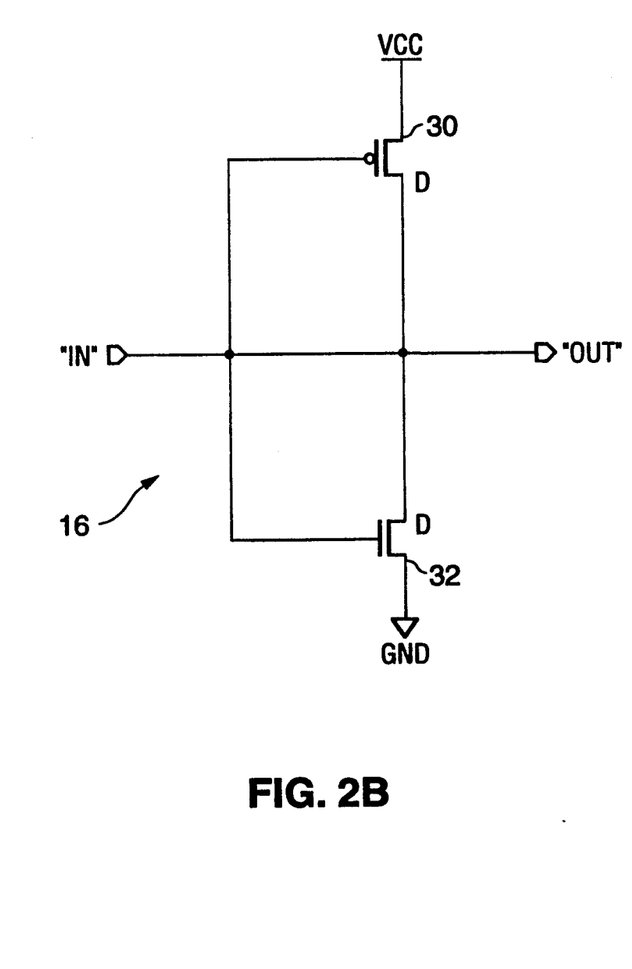

Referring to FIG. 2B, the biasing circuit 16 consists of a P-type MOSFET 30 and an N-type MOSFET 32. However, in this circuit, the gates and drains of both transistors 30, 32 are all connected together. This results in both transistors 30, 32 being biased on, and thereby effectively operating as a voltage divider between VCC and ground. As is known in the art, the actual DC voltage potential available at the output can be preselected by appropriately scaling the device geometries (e.g. the channel widths and lengths) of the two MOSFETs 30, 32.

Figure 3:
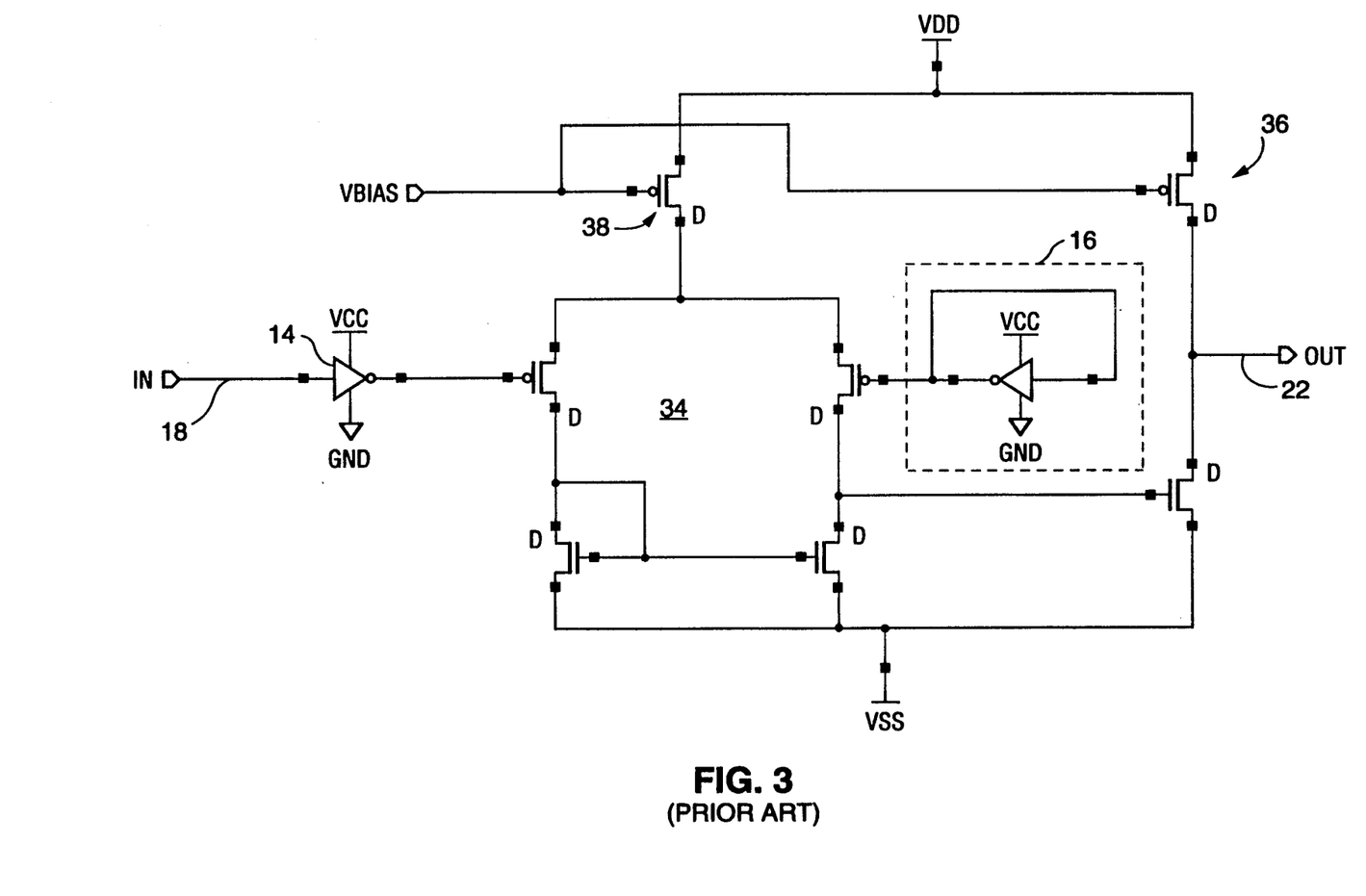
FIG. 3 is a schematic diagram of an alternative conventional digital signal level translator.

Referring to FIG. 3, another conventional digital signal level translator consists of a differential amplifier 34, a totem-pole output amplifier 36, an inverter 14 and biasing circuit 16, connected as shown. This circuit is an improvement over that of FIG. 1 in that the output amplifier 36 has improved fan out and speed as compared to the output latch 12 of FIG. 1. However, static power consumption is still a problem due to the constant current conduction of the differential amplifier 34, driven by a current source 38 and threshold biasing circuit 16, as discussed above.

Figure 4:
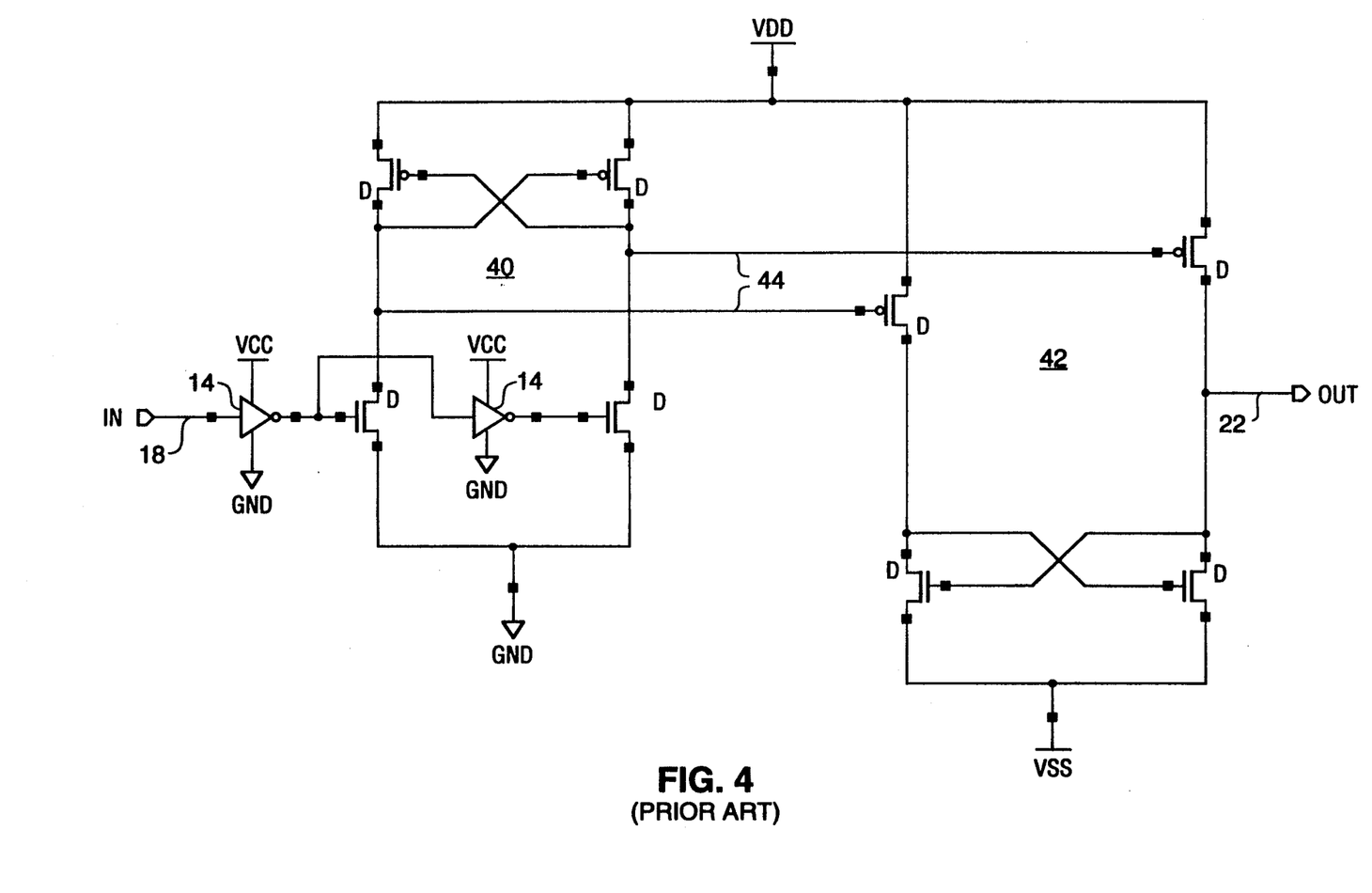
FIG. 4 is a schematic diagram of another alternative conventional digital signal level translator.

Referring to FIG. 4, another conventional digital signal level translator consists of an input latch 40, an output latch 42 and two inverters 14, connected as shown. The gate-driven input latch 40 converts the unbalanced TTL input signal 18 to a differential unbalanced signal 44, which in turn, is converted to a balanced output signal 22. This translator circuit consumes virtually no static power, since neither of its stages 40, 42 conducts current when latched in either of their two logic states. However, this translator circuit still suffers from poor fan out and switching speed, particularly since both stages 40, 42 are serially connected cross-coupled circuits.

Figure 5:
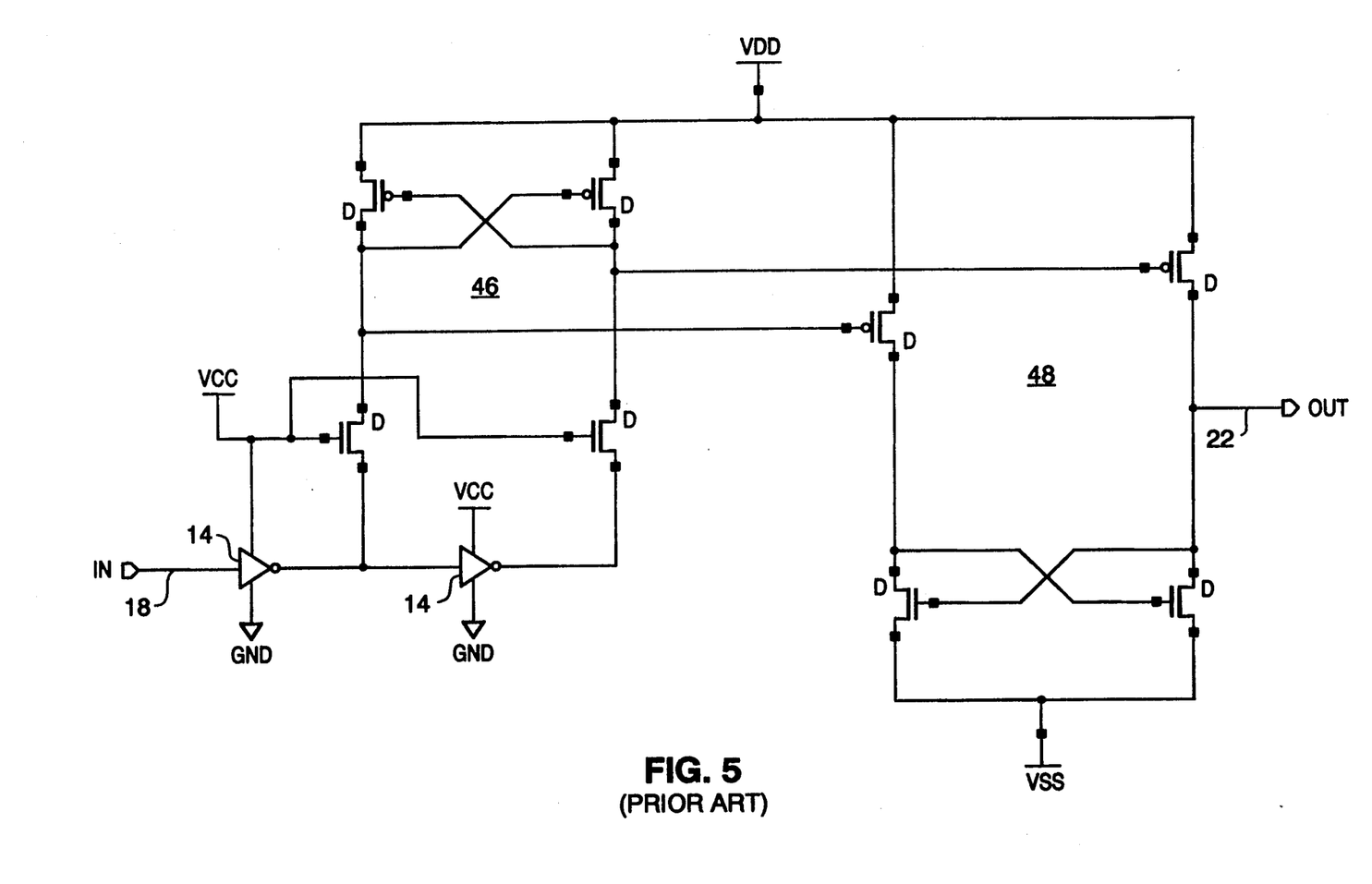
FIG. 5 is a schematic diagram of still another alternative conventional digital signal level translator.

Referring to FIG. 5, another conventional digital signal level translator consists of an input latch 44, an output latch 46 and two inverters 14, connected as shown. This translator circuit is substantially equivalent to that of FIG. 4, with the exception that the input latch 44 is source-driven rather than gate-driven. Hence, although this translator circuit also consumes virtually no static power, it too suffers from poor fan out and speed.

SUMMARY OF THE INVENTION

A digital signal level translator in accordance with the present invention translates an unbalanced digital signal to a balanced digital signal with virtually no static power consumption and improved fan out and switching speed.

The present invention includes first and second signal level translators for receiving and translating an input unbalanced digital signal to a second unbalanced digital signal and a first balanced digital signal, respectively, wherein the input unbalanced digital signal has a dynamic signal range bounded by a first level and a reference level, the second unbalanced digital signal has a dynamic signal range bounded by a second level and the reference level, and the first balanced digital signal has a dynamic signal range bounded by the first level and a third level. Further included is an output buffer for receiving the second unbalanced and first balanced digital signals and providing therefrom an output balanced digital signal, wherein the output balanced digital signal has a dynamic signal range bounded by the second and third levels. The first and second levels have a first polarity relative to the reference level, and the third level has a second polarity relative to the reference level.

In a preferred embodiment of the present invention, the input signal is an unbalanced signal bounded by the circuit reference potential, or "ground" ("GND"), and a positive voltage supply VCC. This GND-VCC signal is also translated simultaneously to another unbalanced digital signal bounded by circuit ground GND and a higher positive voltage supply VDD. Simultaneously, the GND-VCC signal is also translated to a balanced digital signal bounded by a negative voltage supply VSS and VCC. These GND-VDD and VSS-VCC signals are combined to form a balanced digital output signal bounded by VSS and VDD.

These and other features and advantages of the present invention will be understood upon consideration of the following detailed description of the invention and the accompanying drawings.

DETAILED DESCRIPTION OF THE INVENTION

Figure 6:
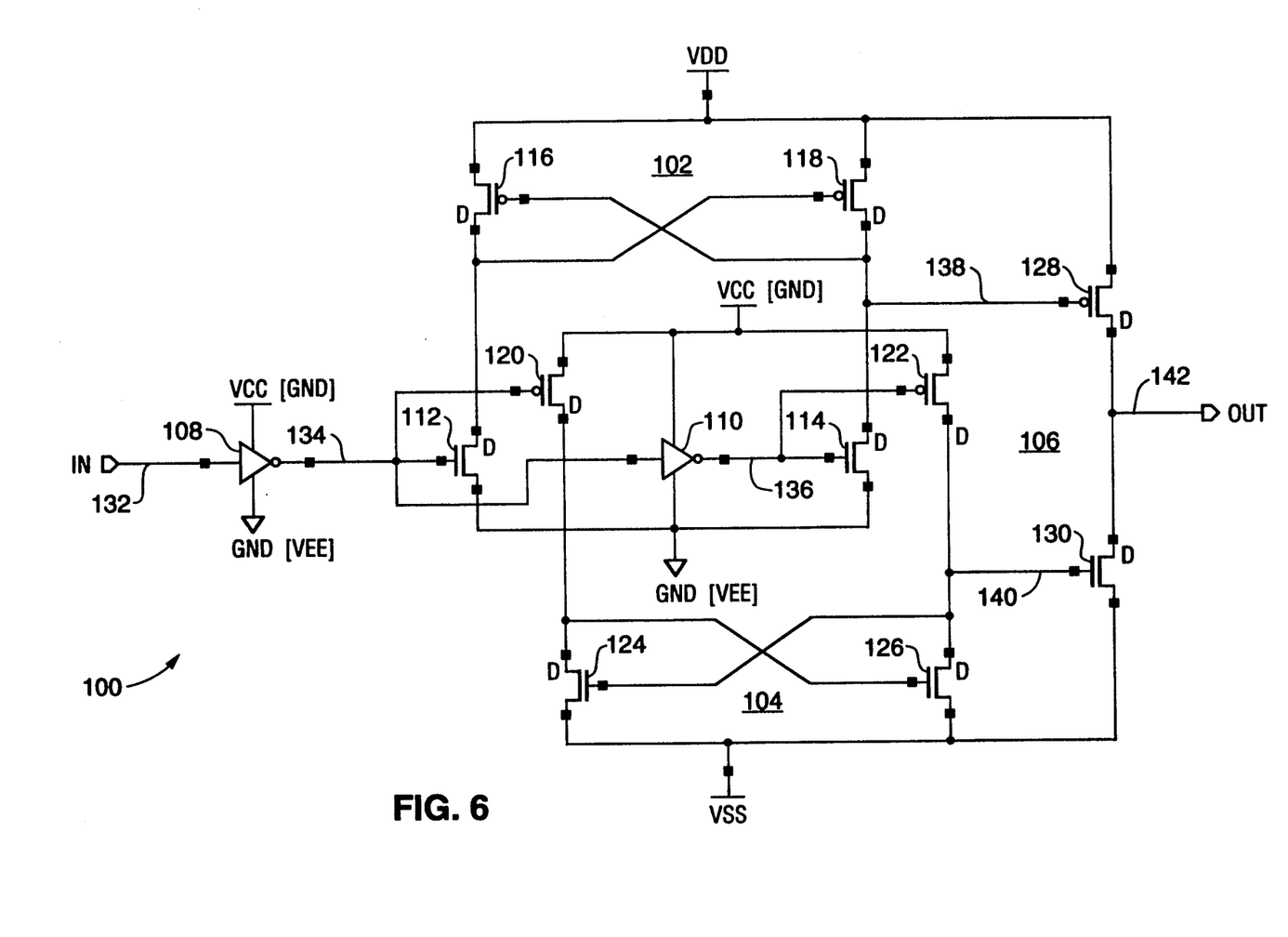
FIG. 6 is a schematic diagram of a digital signal level translator in accordance with the present invention.

Referring to FIG. 6, a digital signal level translator 100 in accordance with the present invention includes a first level translator 102, a second level translator 104, an output buffer 106, and two inverters 108, 110, connected substantially as shown. The first level translator 102 is a gate-driven complementary MOSFET latch including a pair of cross-coupled complementary MOSFET totem-pole amplifiers comprising two gate-driven N-type MOSFETs 112, 114 and two cross-coupled P-type MOSFETs 116, 118. The second level translator 104 is a gate-driven complementary MOSFET latch including a pair of cross-coupled complementary MOSFET totem-pole amplifiers comprising two gate-driven P-type MOSFETs 120, 122 and two cross-coupled N-type MOSFETs 124, 126. The output buffer 106 is a complementary MOSFET totem-pole buffer amplifier comprising a P-type MOSFET 128 and an N-type MOSFET 130.

A TTL input signal 132 is received by the input inverter 108, which is biased between a positive voltage supply VCC (e.g. +5 volts dc) and circuit ground GND. The inverted TTL input signal 134 is applied to the gates of two of the input MOSFETs 112, 120 of the first 102 and second 104 level translators and the input of the second inverter 110. The doubly inverted TTL input signal 136 is applied to the gates of the other two input MOSFETs 114, 122 of the first 102 and second 104 level translators.

The first level translator 102 produces an unbalanced output signal 138 which has an unbalanced dynamic signal range bounded by circuit ground potential GND and the positive voltage supply VDD (e.g. +10 volts dc) of the first level translator 102. The second level translator 104 produces an asymmetrically balanced output signal 140 having an asymmetrically balanced dynamic signal range bounded by the TTL positive voltage supply VCC and the negative voltage supply VSS (e.g. −10 volts dc) of the second level translator 104.

The unbalanced signal 138 and the asymmetrically balanced signal 140 are received by the complementary MOSFETs 128 and 130, respectively, of the output buffer 106 and combined to produce a symmetrically balanced output signal 142 having a symmetrically balanced dynamic signal range bounded by the positive voltage supply VDD and negative voltage supply VSS of the first 102 and second 104 level translators, respectively.

Figure 7:
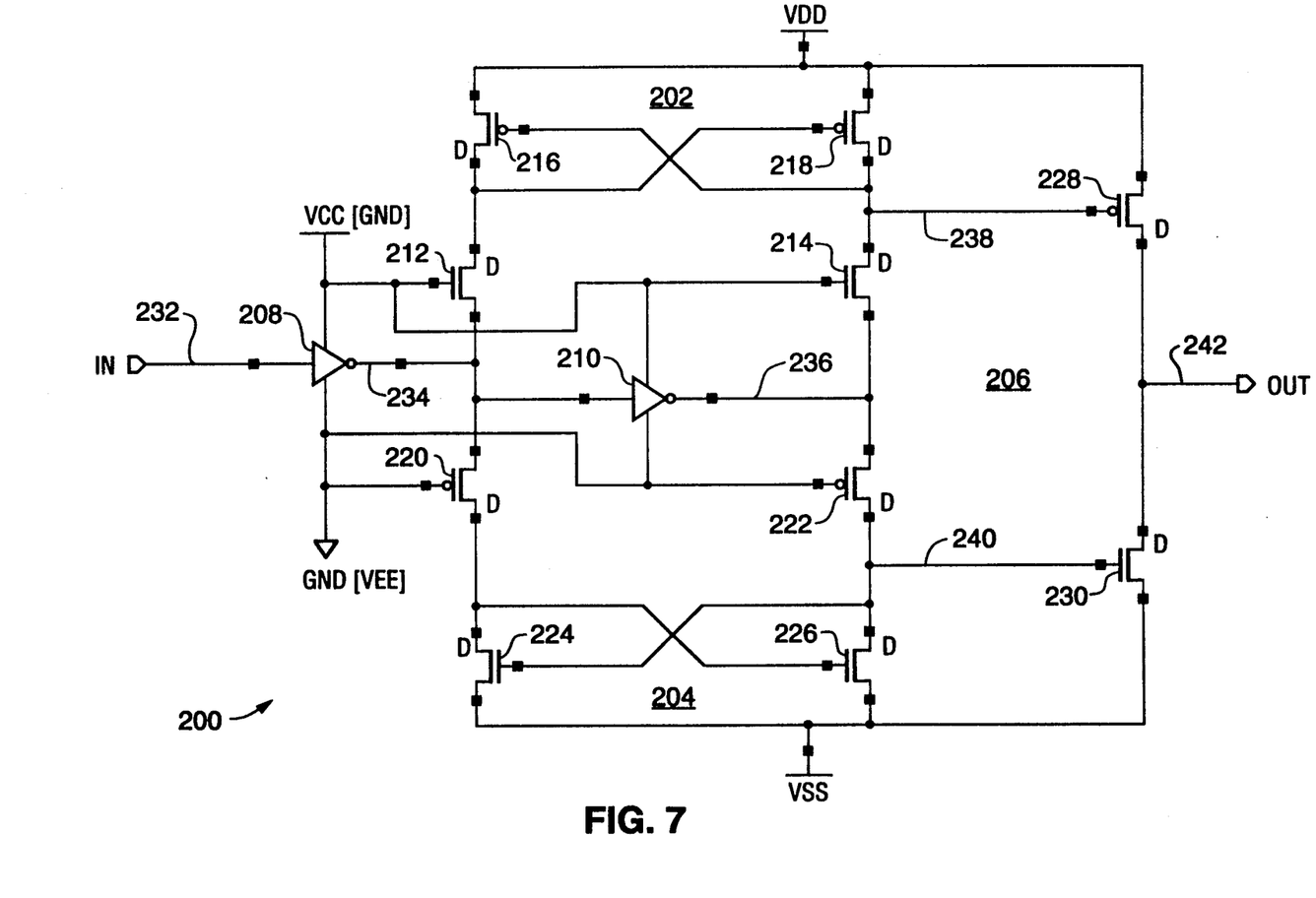
FIG. 7 is a schematic diagram of an alternative digital signal level translator in accordance with the present invention.

Referring to FIG. 7, an alternative digital signal level translator 200 in accordance with the present invention includes a first level translator 202, a second level translator 204, an output buffer 206, and two inverters 208, 210, connected substantially as shown. The first level translator 202 is a source-driven complementary MOSFET latch including a pair of cross-coupled complementary MOSFET totem-pole amplifiers comprising two source-driven N-type MOSFETs 212, 214 and two cross-coupled P-type MOSFETs 216, 218. The second level translator 204 is a source-driven complementary MOSFET latch including a pair of cross-coupled complementary MOSFET totem-pole amplifiers comprising two source-driven P-type MOSFETs 220, 222 and two cross-coupled N-type MOSFETs 224, 226. The output buffer 206 is a complementary MOSFET totem-pole buffer amplifier comprising a P-type MOSFET 228 and an N-type MOSFET 230.

A TTL input signal 232 is received by the input inverter 208, which is biased between a positive voltage supply VCC (e.g. +5 volts dc) and circuit ground GND. The inverted TTL input signal 234 is applied to the sources of two of the input MOSFETs 212, 220 of the first 202 and second 204 level translators and the input of the second inverter 210. The doubly inverted TTL input signal 236 is applied to the sources of the other two input MOSFETs 214, 222 of the first 202 and second 204 level translators.

The first level translator 202 produces an unbalanced output signal 238 which has an unbalanced dynamic signal range bounded by circuit ground potential GND and the positive voltage supply VDD (e.g. +10 volts dc) of the first level translator 202. The second level translator 204 produces an asymmetrically balanced output signal 240 having an asymmetrically balanced dynamic signal range bounded by the TTL positive voltage supply VCC and the negative voltage supply VSS (e.g. −10 volts dc) of the second level translator 204.

The unbalanced signal 238 and the asymmetrically balanced signal 240 are received by the complementary MOSFETs 228 and 230, respectively, of the output buffer 206 and combined to produce a symmetrically balanced output signal 242 having a symmetrically balanced dynamic signal range bounded by the positive voltage supply VDD and negative voltage supply VSS of the first 202 and second 204 level translators, respectively.

Figure 8:
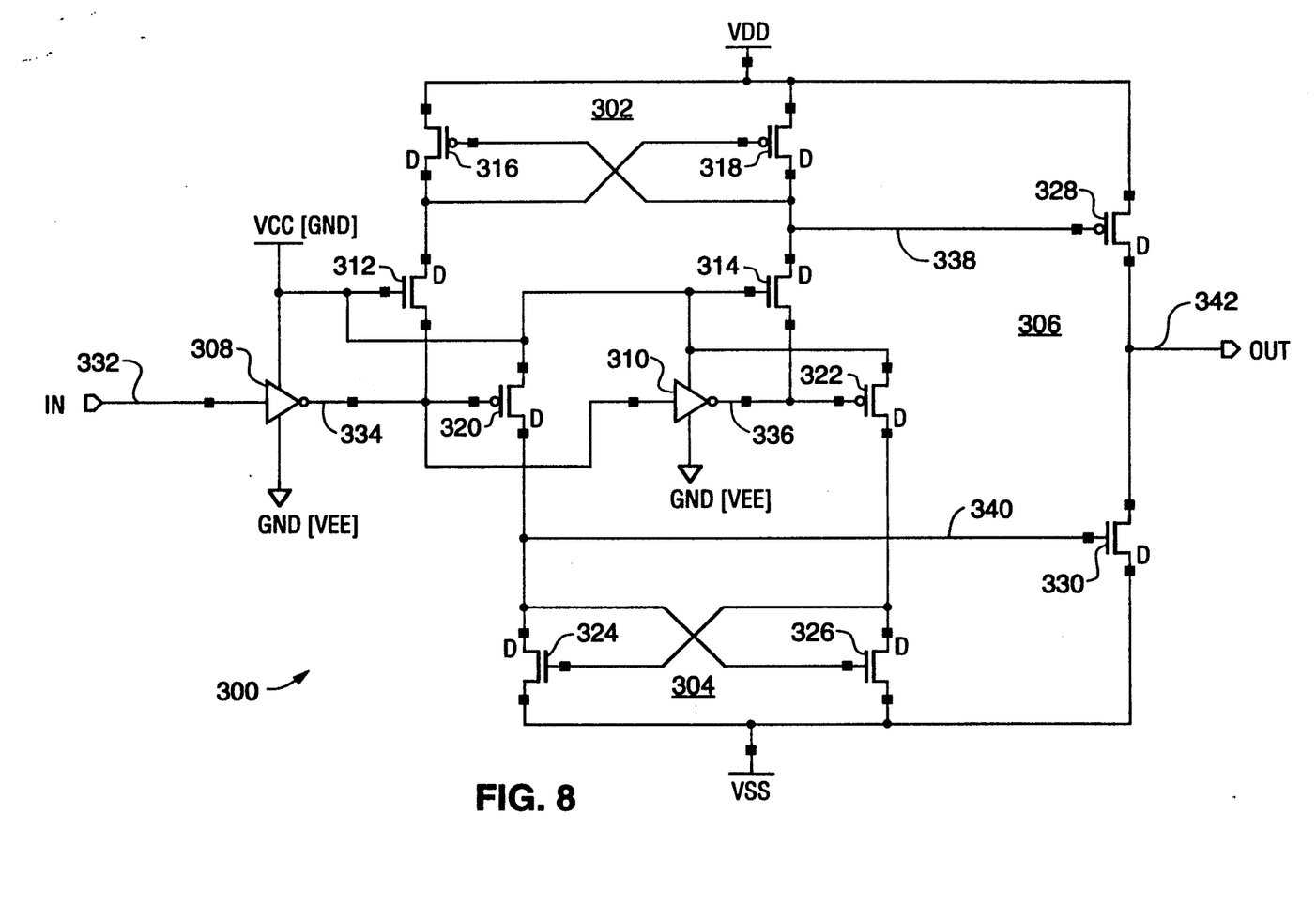
FIG. 8 is schematic diagram of another alternative digital signal level translator in accordance with the present invention.

Referring to FIG. 8, another alternative digital signal level translator 300 in accordance with the present invention includes a first level translator 302, a second level translator 304, an output buffer 306, and two inverters 308, 310, connected substantially as shown. The first level translator 302 is a source-driven complementary MOSFET latch including a pair of cross-coupled complementary MOSFET totem-pole amplifiers comprising two source-driven N-type MOSFETs 312, 314 and two cross-coupled P-type MOSFETs 316, 318. The second level translator 304 is a gate-driven complementary MOSFET latch including a pair of cross-coupled complementary MOSFET totem-pole amplifiers comprising two gate-driven P-type MOSFETs 320, 322 and two cross-coupled N-type MOSFETs 324, 326. The output buffer 306 is a complementary MOSFET totem-pole buffer amplifier comprising a P-type MOSFET 328 and an N-type MOSFET 330.

A TTL input signal 332 is received by the input inverter 308, which is biased between a positive voltage supply VCC (e.g. +5 volts dc) and circuit ground GND. The inverted TTL input signal 334 is applied to the source of an input MOSFET 312 of the first level translator 302, the gate of an input MOSFET 320 of the second level translator 304 and the input of the second inverter 310. The doubly inverted TTL input signal 336 is applied to the source of another input MOSFET 314 of the first level translator 302 and the gate of another input MOSFET 322 of the second level translator 304.

The first level translator 302 produces an unbalanced output signal 338 which has an unbalanced dynamic signal range bounded by circuit ground potential GND and the positive voltage supply VDD (e.g. +10 volts dc) of the first level translator 302. The second level translator 304 produces an asymmetrically balanced output signal 340 having an asymmetrically balanced dynamic signal range bounded by the TTL positive voltage supply VCC and the negative voltage supply VSS (e.g. −10 volts dc) of the second level translator 304.

The unbalanced signal 338 and the asymmetrically balanced signal 340 are received by the complementary MOSFETs 328 and 330, respectively, of the output buffer 306 and combined to produce a symmetrically balanced output signal 342 having a symmetrically balanced dynamic signal range bounded by the positive voltage supply VDD and negative voltage supply VSS of the first 302 and second 304 level translators, respectively.

As indicated within brackets in FIGS. 6–8, the inverters 108, 110, 208, 210, 308, 310 can alternatively be biased between circuit ground GND and a negative voltage supply VEE (e.g. −5 volts dc) to accommodate input signals 132, 232, 332 having logic levels bounded by circuit ground potential GND and the negative voltage supply VEE. Accordingly, the biasing potentials for the first 102, 202, 302 and second 104, 204, 304 translators would be GND and VEE instead of VCC and GND, respectively, also as indicated within brackets. Further, the output signals 138, 238, 338 of the first level translators 102, 202, 302 would be asymmetrically balanced with asymmetrically balanced dynamic signal ranges bounded by VEE and GND; and the output signals 140, 240, 340 of the second level translators 104, 204, 304 would be unbalanced with unbalanced dynamic signal ranges bounded by GND and VSS.

The digital signal level translators 100, 200, 300 of FIGS. 6–8 offer several advantages over conventional translator circuits. The first 102, 202, 302 and second 104, 204, 304 level translators are complementary MOSFET bistable latch circuits with no passive dc "biasing circuits"; therefore, regardless of which logic state the latch circuits are in, virtually no static power is consumed. Further, the output buffers 106, 206, 306 are complementary MOSFET totem-pole buffer amplifiers, and therefore consume virtually no static DC power and provide good fan out capacity. Further still, even though the first 102, 202, 302 and second 104, 204, 304 level translators are cross-coupled circuits, they operate in parallel and not in series; therefore, any switching delay introduced by them is minimized.

It should be understood that various alternatives to the embodiments of the present invention described herein can be employed in practicing the invention. It is intended that the following claims define the scope of the present invention, and that structures and methods within the scope of these claims and their equivalents be covered thereby.

What is claimed is:

1. A digital signal level translator for translating an unbalanced digital signal to a balanced digital signal, said digital signal level translator comprising:

first translator means for receiving and translating a first unbalanced digital signal to a second unbalanced digital signal, wherein said first unbalanced digital signal has a first unbalanced dynamic signal range bounded by a first level and a reference level, and wherein said second unbalanced digital signal has a second unbalanced dynamic signal range bounded by a second level and said reference level;

second translator means for receiving and translating said first unbalanced digital signal to a first balanced digital signal, wherein said first balanced digital signal has a first balanced dynamic signal range bounded by said first level and a third level; and output buffer means for receiving said second unbalanced digital signal and said first balanced digital signal, and for providing a second balanced digital signal, wherein said second balanced digital signal has a second balanced dynamic signal range bounded by said second level and said third level;

wherein said first and second levels have a first polarity relative to said reference level, and said third level has a second polarity relative to said reference level.

2. A digital signal level translator as recited in claim 1, further comprising inverter means coupled to said first and second translator means for receiving and inverting said first unbalanced digital signal.

3. A digital signal level translator as recited in claim 1, wherein said first translator means comprises a first gate-driven complementary MOSFET latch including a pair of cross-coupled complementary MOSFET totem-pole amplifiers.

4. A digital signal level translator as recited in claim 1, wherein said second translator means comprises a second gate-driven complementary MOSFET latch including a pair of cross-coupled complementary MOSFET totem-pole amplifiers.

5. A digital signal level translator as recited in claim 1, wherein said first translator means comprises a first source-driven complementary MOSFET latch including a pair of cross-coupled complementary MOSFET totem-pole amplifiers.

6. A digital signal level translator as recited in claim 1, wherein said second translator means comprises a second source-driven complementary MOSFET latch including a pair of cross-coupled complementary MOSFET totem-pole amplifiers.

7. A digital signal level translator as recited in claim 1, wherein said output buffer means comprises a complementary MOSFET totem-pole buffer amplifier including a first MOSFET for receiving said second unbalanced digital signal and a complementary second MOSFET for receiving said first balanced digital signal.

8. A digital signal level translation method for translating an unbalanced digital signal to a balanced digital signal, said digital signal level translation method comprising the steps of:

receiving a first unbalanced digital signal having a first unbalanced dynamic signal range bounded by a first level and a reference level;

translating said first unbalanced digital signal to a second unbalanced digital signal having a second unbalanced dynamic signal range bounded by a second level and said reference level;

translating said first unbalanced digital signal to a first balanced digital signal having a first balanced dynamic signal range bounded by said first level and a third level;

combining said second unbalanced digital signal and said first balanced digital signal to provide a second balanced digital signal having a second balanced dynamic signal range bounded by said second level and said third level;

wherein said first and second levels have a first polarity relative to said reference level, and said third level has a second polarity relative to said reference level.

9. A digital signal level translation method as recited in claim 8, further comprising the step of inverting said first unbalanced digital signal.

10. A digital signal level translation method as recited in claim 8, wherein said step of translating said first unbalanced digital signal to a second unbalanced digital signal comprises inputting said first unbalanced digital signal into and outputting said second unbalanced digital signal from a first gate-driven complementary MOSFET latch including a pair of cross-coupled complementary MOSFET totem-pole amplifiers.

11. A digital signal level translation method as recited in claim 8, wherein said step of translating said first unbalanced digital signal to a first balanced digital signal comprises inputting said first unbalanced digital signal into and outputting said first balanced digital signal from a second gate-driven complementary MOSFET latch including a pair of cross-coupled complementary MOSFET totem-pole amplifiers.

12. A digital signal level translation method as recited in claim 8, wherein said step of translating said first unbalanced digital signal to a second unbalanced digital signal comprises inputting said first unbalanced digital signal into and outputting said second unbalanced digital signal from a first source-driven complementary MOSFET latch including a pair of cross-coupled complementary MOSFET totem-pole amplifiers.

13. A digital signal level translation method as recited in claim 8, wherein said step of translating said first unbalanced digital signal to a first balanced digital signal comprises inputting said first unbalanced digital signal into and outputting said first balanced digital signal from a second source-driven complementary MOSFET latch including a pair of cross-coupled complementary MOSFET totem-pole amplifiers.

14. A digital signal level translation method as recited in claim 8, wherein said step of combining said second unbalanced digital signal and said first balanced digital signal to provide a second balanced digital signal comprises inputting said second unbalanced digital signal and said first balanced digital signal into first and second complementary MOSFETs, respectively, of a complementary MOSFET totem-pole buffer amplifier, and further comprises outputting therefrom said second balanced digital signal.

* * * * *